(12) United States Patent
AuBuchon et al.

(10) Patent No.: US 10,787,739 B2
(45) Date of Patent: Sep. 29, 2020

(54) SPATIAL WAFER PROCESSING WITH IMPROVED TEMPERATURE UNIFORMITY

(71) Applicant: Applied Materials, Inc., Santa Clara, CA (US)

(72) Inventors: Joseph AuBuchon, San Jose, CA (US); Sanjeev Baluja, Campbell, CA (US); Dhritiman Subha Kashyap, Bangalore (IN); Jared Ahmad Lee, San Jose, CA (US); Tejas Ulavi, San Jose, CA (US); Michael Rice, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/658,393

(22) Filed: Oct. 21, 2019

(65) Prior Publication Data
US 2020/0131635 A1    Apr. 30, 2020

Related U.S. Application Data

(60) Provisional application No. 62/751,904, filed on Oct. 29, 2018.

(51) Int. Cl.
*C23C 16/455* (2006.01)
*C23C 16/458* (2006.01)
*H01L 21/67* (2006.01)

(52) U.S. Cl.
CPC .... *C23C 16/45536* (2013.01); *C23C 16/4583* (2013.01); *C23C 16/45544* (2013.01); *H01L 21/67115* (2013.01)

(58) Field of Classification Search
CPC .......... C23C 16/45536; C23C 16/4583; C23C 16/45544; H01L 21/67115
See application file for complete search history.

(56) References Cited

U.S. PATENT DOCUMENTS

| | | | |
|---|---|---|---|
| 6,592,661 B1 * | 7/2003 | Thakur | C30B 31/12 117/103 |
| 2012/0132618 A1 * | 5/2012 | Baluja | G02B 5/208 216/66 |

(Continued)

FOREIGN PATENT DOCUMENTS

| KR | 101046613 B1 | 7/2011 |
|---|---|---|
| KR | 101134277 B1 | 4/2012 |
| KR | 20120038675 A | 4/2012 |

OTHER PUBLICATIONS

PCT International Search Report and Written Opinion in PCT/US2019/057324 dated Mar. 25, 2020, 9 pages.

*Primary Examiner* — Ahmed N Sefer
(74) *Attorney, Agent, or Firm* — Servilla Whitney LLC

(57) ABSTRACT

Apparatus and methods to process one or more wafers are described. A processing chamber comprises a first processing station comprising a first gas injector having a first face, a first emissivity and a first temperature, a second processing station comprising a second gas injector having a second face, a second emissivity and a second temperature, and a substrate support assembly comprising a plurality of substantially coplanar support surfaces, the substrate support assembly configured to move the support surfaces between the first processing station and the second processing station. When a wafer is on the support surfaces, a temperature skew of less than about 0.5° C. is developed upon moving the wafer between the stations in about 0.5 seconds.

16 Claims, 6 Drawing Sheets

(56) References Cited

U.S. PATENT DOCUMENTS

| | | | |
|---|---|---|---|
| 2014/0127404 A1 | 5/2014 | Yudovsky et al. | |
| 2014/0342555 A1* | 11/2014 | Lam | C23C 16/482 |
| | | | 438/681 |
| 2016/0056032 A1 | 2/2016 | Baldasseroni et al. | |
| 2017/0053792 A1 | 2/2017 | Lu et al. | |

* cited by examiner

SPATIAL WAFER PROCESSING WITH IMPROVED TEMPERATURE UNIFORMITY

CROSS-REFERENCE TO RELATED APPLICATIONS

This application claims priority to U.S. Provisional Application No. 62/751,904, filed Oct. 29, 2018, the entire disclosure of which is hereby incorporated by reference herein.

TECHNICAL FIELD

The present disclosure relates generally to apparatus and methods for processing a wafer. In particular, the disclosure relates to a processing chamber having matching thermal environments for a wafer being processed.

BACKGROUND

Current atomic layer deposition (ALD) processes have a number of potential issues and difficulties. Many ALD chemistries (e.g., precursors and reactants) are "incompatible", which means that the chemistries cannot be mixed together. If the incompatible chemistries mix, a chemical vapor deposition (CVD) process, instead of the ALD process could occur. The CVD process generally has less thickness control than the ALD process and/or can result in the creation of gas phase particles which can cause defects in the resultant device. For a traditional time-domain ALD process in which a single reactive gas is flowed into the processing chamber at a time, a long purge/pump out time occurs so that the chemistries are not mixed in the gas phase. A spatial ALD chamber can move one or more wafer(s) from one environment to a second environment faster than a time-domain ALD chamber can pump/purge, resulting in higher throughput.

The semiconductor industry requires high quality films which can be deposited at lower temperatures (e.g., below 350° C.). To deposit high quality films at temperatures below where the film would be deposited with a thermal only process, alternative energy sources are needed. Plasma solutions can be used to provide the additional energy in the form of ions and radicals to the ALD film. The challenge is to get sufficient energy on the vertical side wall ALD film. Ions typically are accelerated through a sheath above the wafer surface in a direction normal to the wafer surface. Therefore, the ions provide energy to horizontal ALD film surfaces, but provide an insufficient amount of energy to the vertical surfaces because the ions moving parallel to the vertical surfaces.

Current spatial ALD processing chambers rotate a plurality of wafers on a heated circular platen at a constant speed which moves the wafers from one processing environment to an adjacent environment. The different processing environments create a separation of the incompatible gases. However, current spatial ALD processing chambers do not enable the plasma environment to be optimized for plasma exposure, resulting in non-uniformity, plasma damage and/or processing flexibility issues.

In current spatial ALD deposition tools (or other spatial processing chambers), a wafer is moved into different thermal environments. The difference in times that each part of the wafer spends in each thermal environment can result in temperature non-uniformity on the wafer. Temperature uniformity has one of the highest impacts on film uniformity (e.g. thickness, as well as properties such as refractive index, wet etch rate, in-plane displacement, etc.). Therefore, there is a need in the art for improved deposition apparatus and methods.

SUMMARY

One or more embodiments of the disclosure are directed to a processing chamber. In one embodiment, a processing chamber comprises: a first processing station comprising a first gas injector having a first face, a first emissivity and a first temperature; a second processing station comprising a second gas injector having a second face, a second emissivity and a second temperature; and a substrate support assembly comprising a plurality of substantially coplanar support surfaces, the substrate support assembly configured to move the support surfaces between the first processing station and the second processing station, wherein the first face is spaced a first distance from the plurality of support surfaces and the second face is spaced a second distance from the plurality of support surfaces, and the first emissivity is lower than the second emissivity and/or the first temperature is greater than the second temperature.

Additional embodiments of the disclosure are direct to processing methods. In one or more embodiments, a processing method comprises: moving a substrate support surface between a first processing station and a second processing station, the first processing station comprising a first gas injector having a first face spaced a first distance from the support surface, a first emissivity and a first temperature, the second processing station comprising a second gas injector having a second face spaced a second distance from the support surface, a second emissivity and a second temperature, wherein the first emissivity is lower than the second emissivity and/or the first temperature is greater than the second temperature.

One or more embodiments are directed to a processing chamber comprising: a thermal processing station comprising a thermal showerhead having a first face, a first emissivity and a first temperature; a plasma processing station comprising a plasma showerhead having a second face, a second emissivity and a second temperature; a substrate support assembly comprising a plurality of substantially coplanar support surfaces having at least one wafer thereon, the substrate support assembly configured to move the at least one wafer between the thermal processing station and the plasma processing station; and a controller connected to the plurality of substantially coplanar support surfaces, wherein the first face is spaced in a range of about 0.5 mm to about 3 mm from the at least one wafer and the second face is spaced in a range of about 7 mm to about 15 mm from the at least one wafer, and the first emissivity is lower than the second emissivity and/or the first temperature is greater than the second temperature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
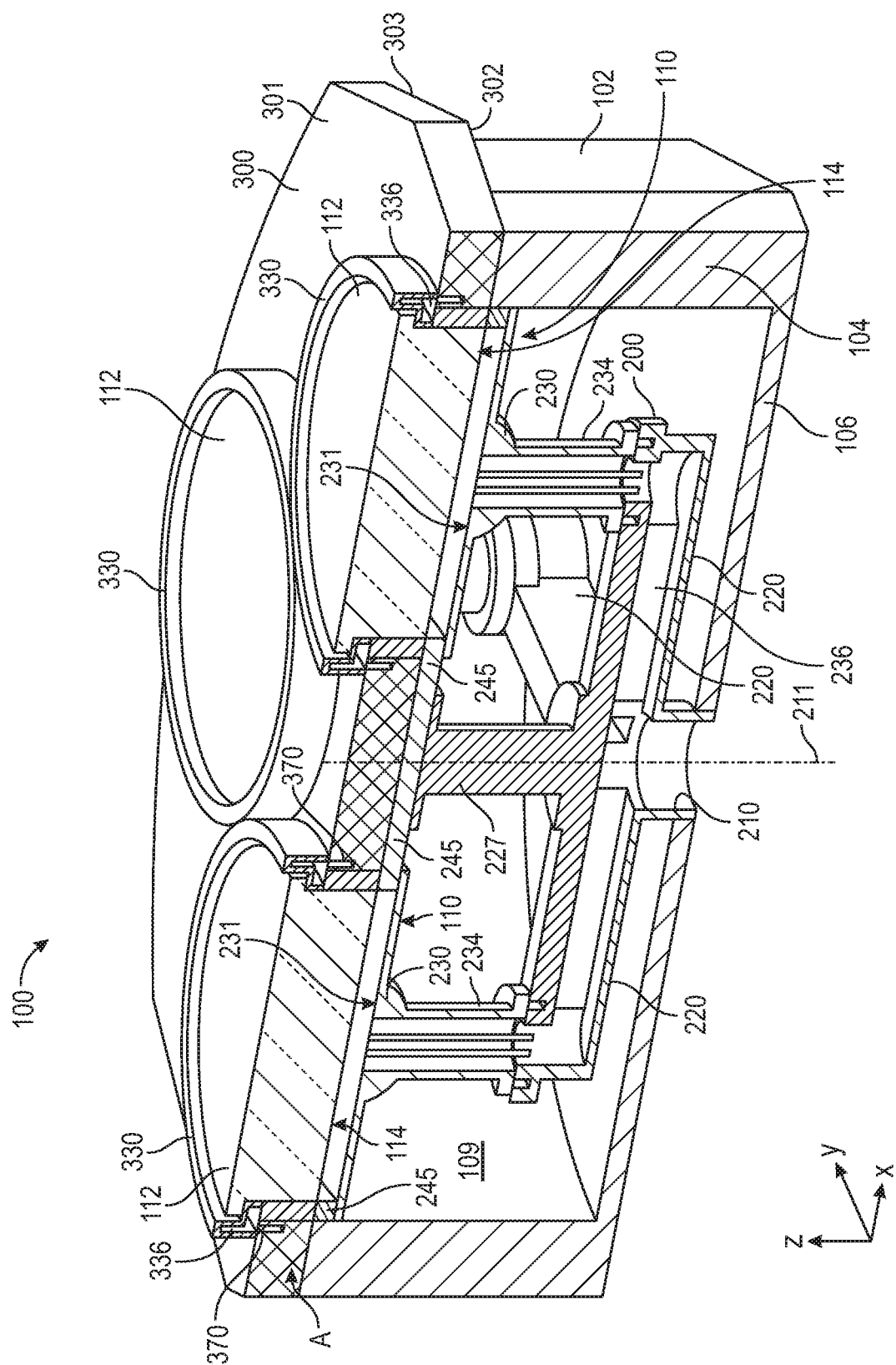
FIG. 1 shows an cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure use matching thermal environments for the wafer (or minimized differences between the thermal environments) through combinations of temperature control, distance from the wafer, and emissivity of the wafer facing surface. Some embodiments advantageously provide an uniform environment around each station to minimize azimuthal variation.

One or more embodiments of the disclosure are directed to processing chambers having at least two spatially separated processing environments, also referred to as processing stations. Some embodiments have more than two and some embodiments have more than four processing stations. The processing environments can be mounted coplanar to the wafer(s) that are moving in a horizontal plane. The process environments are placed in a circular arrangement. A rotatable structure with one to four (or more) individual wafer heaters mounted thereon moves the wafers in a circular path with a diameter similar to the process environments. Each heater may be temperature controlled and may have one or multiple concentric zones. For wafer loading, the rotatable structure could be lowered so that a vacuum robot could pick finished wafers and place unprocessed wafers on lift pins located above each wafer heater (in the lower Z position). In operation, each wafer can be under an independent environment until the process is finished, then rotatable structure can rotate to move the wafers on the heaters to the next environment (90° rotation for four stations, 120° rotation if three stations) for processing.

In a spatial ALD deposition tool (or other spatial processing chamber), a wafer is moved into different thermal environment. The difference in times that each part of the wafer spends in each thermal environment results in non-uniformity on the wafer. Temperature uniformity has one of the highest impacts on film uniformity (thickness, as well as properties such as refractive index, wet etch rate, in-plane displacement, etc.).

One or more embodiments, advantageously provide a processing chamber wherein different stations in a processing tool (e.g. spatial tool) are designed to result in matching thermal environments for the wafer (or minimized thermal differences) through combinations of temperature control, distance from the wafer, and emissivity of the wafer facing surface. In one or more embodiments, tight thermal control is also advantageously maintained during wafer movement using a combination of temperature control, distance from the wafer, and emissivity of the wafer facing surface. In one or more embodiments, the processing chamber is advantageously designed to provide an uniform environment around each processing station to minimize azimuthal variation.

In one or more embodiments, a processing chamber comprises a first processing station comprising a first gas injector having a first face, a first emissivity and a first temperature; a second processing station comprising a second gas injector having a second face, a second emissivity and a second temperature; and a substrate support assembly comprising a plurality of substantially coplanar support surfaces, the substrate support assembly configured to move the support surfaces between the first processing station and the second processing station. The first face is spaced a first distance from the plurality of support surfaces and the second face is spaced a second distance from the plurality of support surfaces, and the first emissivity is lower than the second emissivity and/or the first temperature is greater than the second temperature.

Figure 2:
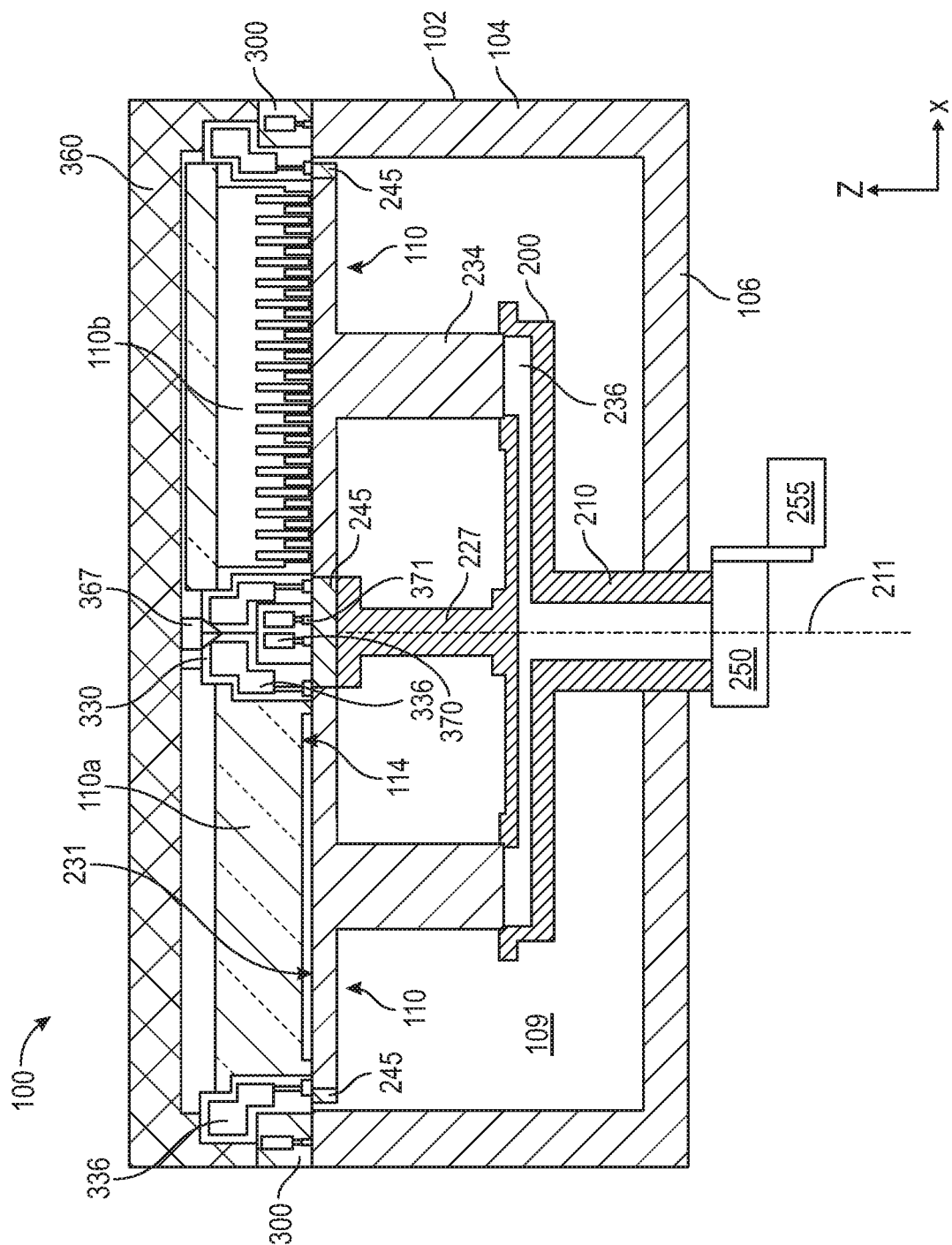
FIG. 2 shows a cross-sectional view of a processing chamber in accordance with one or more embodiment of the disclosure.

FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a support assembly 200 and top plate 300.

The processing chamber 100 has a housing 102 with walls 104 and a bottom 106. The housing 102 along with the top plate 300 define an interior volume 109, also referred to as a processing volume.

The processing chamber 100 includes a plurality of processing stations 110. The processing stations 110 are located in the interior volume 109 of the housing 102 and are positioned in a circular arrangement around the rotational axis 211 of the support assembly 200. Each processing station 110 comprises a gas injector 112 having a front face 114. In some embodiments, the front faces 114 of each of the gas injectors 112 are substantially coplanar. The processing stations 110 are defined as a region in which processing can occur. For example, a processing station 110 can be defined by the support surface 231 of the heaters 230, as described below, and the front face 114 of the gas injectors 112.

The processing stations 110 can be configured to perform any suitable process and provide any suitable process conditions. The type of gas injector 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
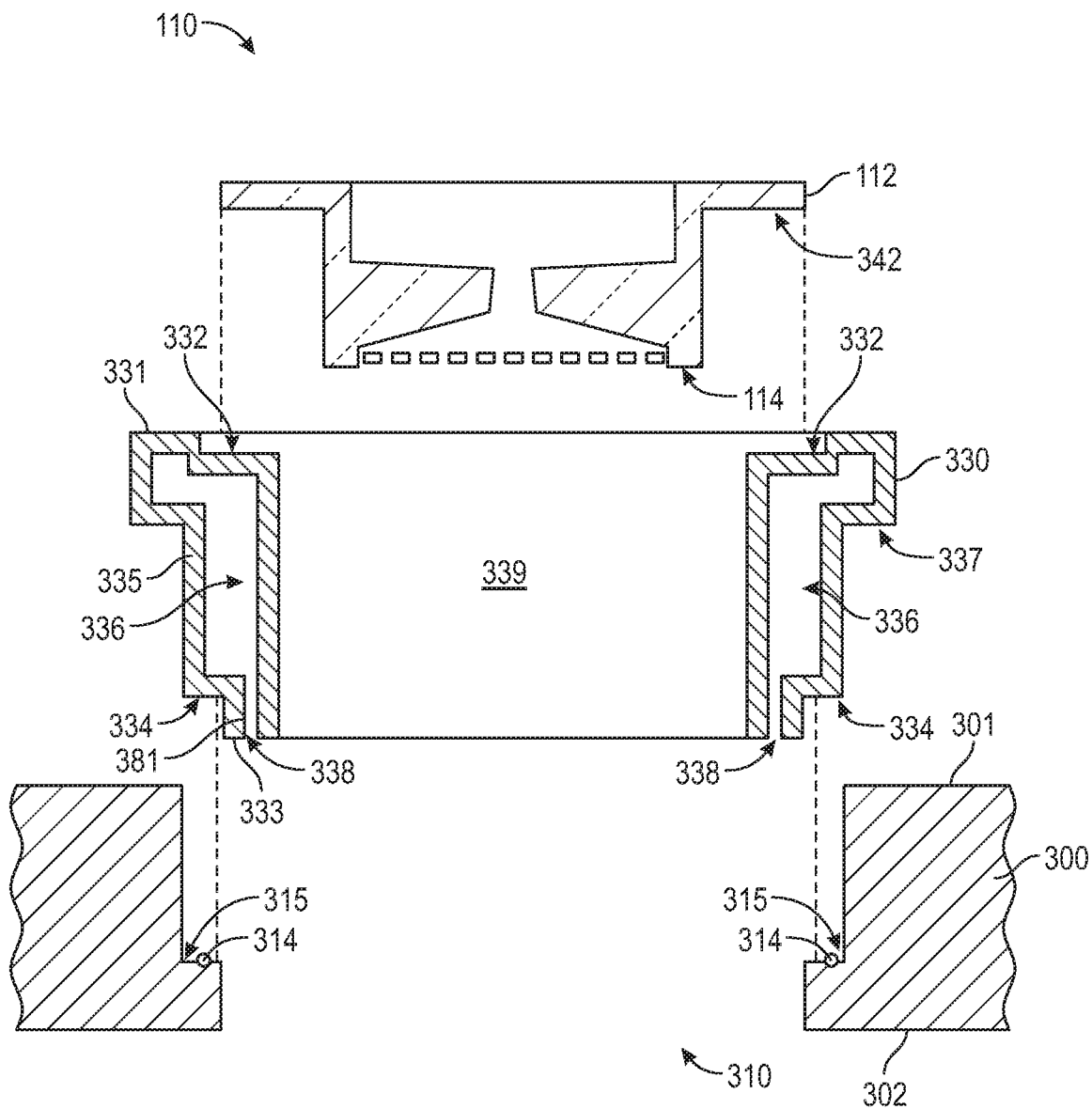
FIG. 3 is an exploded cross-sectional view of a processing station in accordance with one or more embodiment of the disclosure.

FIG. 3 illustrates an exploded view of a processing station 110 in accordance with one or more embodiment of the disclosure. The processing station 110 illustrated comprises three main components: the top plate 300 (also called a lid), a pump/purge insert 330 and a gas injector 112. The gas injector 112 shown in FIG. 3 is a showerhead type gas injector. In some embodiments, the insert 330 is connected to or in fluid communication with a vacuum (exhaust). In some embodiments, the insert 330 is connected to or in fluid communication with a purge gas source.

The openings 310 in the top plate 300 can be uniformly sized or have different sizes. Different sized/shape gas injectors 112 can be used with a pump/purge insert 330 that is suitably shaped to transition from the opening 310 to the gas injector 112. For example, as illustrated, the pump/purge insert 330 includes a top 331 and bottom 333 with a sidewall 335. When inserted into the opening 310 in the top plate 300, a ledge 334 adjacent the bottom 333 can be positioned on the shelf 315 formed in the opening 310. In some embodiments, there is no shelf 315 in the opening and a flange portion 337 of the pump/purge insert 330 rests on top of the top plate 300. In the illustrated embodiment, the ledge 334 rests on shelf 315 with an o-ring 314 positioned between to help form a gas-tight seal.

In some embodiments, there are one or more purge rings 309 in the top plate 300. The purge rings 309 can be in fluid communication with a purge gas plenum (not shown) or a purge gas source (not shown) to provide a positive flow of purge gas to prevent leakage of processing gases from the processing chamber.

The pump/purge insert 330 of some embodiments includes a gas plenum 336 with at least one opening 338 in the bottom 333 of the pump/purge insert 330. The gas plenum 336 has an inlet (not shown), typically near the top 331 or sidewall 335 of the pump/purge insert 330.

In some embodiments, the plenum 336 can be charged with a purge or inert gas which can pass through the opening 338 in the bottom 333 of the pump/purge insert 330. The gas flow through the opening 338 can help create a gas curtain type barrier to prevent leakage of process gases from the interior of the processing chamber.

In some embodiments, the plenum 336 is connected to or in fluid communication with a vacuum source. In such an embodiment, gases flow through the opening 338 in the bottom 333 of the pump/purge insert 330 into the plenum 336. The gases can be evacuated from the plenum to exhaust. Such arrange can be used to evacuate gases from the processing station 110 during use.

The pump/purge insert 330 includes an opening 339 in which a gas injector 112 can be inserted. The gas injector 112 illustrated has a flange 342 which can be in contact with the ledge 332 adjacent the top 331 of the pump/purge insert 330. The diameter or width of the gas injector 112 can be any suitable size that can fit within the opening 339 of the pump/purge insert 330. This allows gas injectors 112 of various types to be used within the same opening 310 in the top plate 300.

Figure 4:
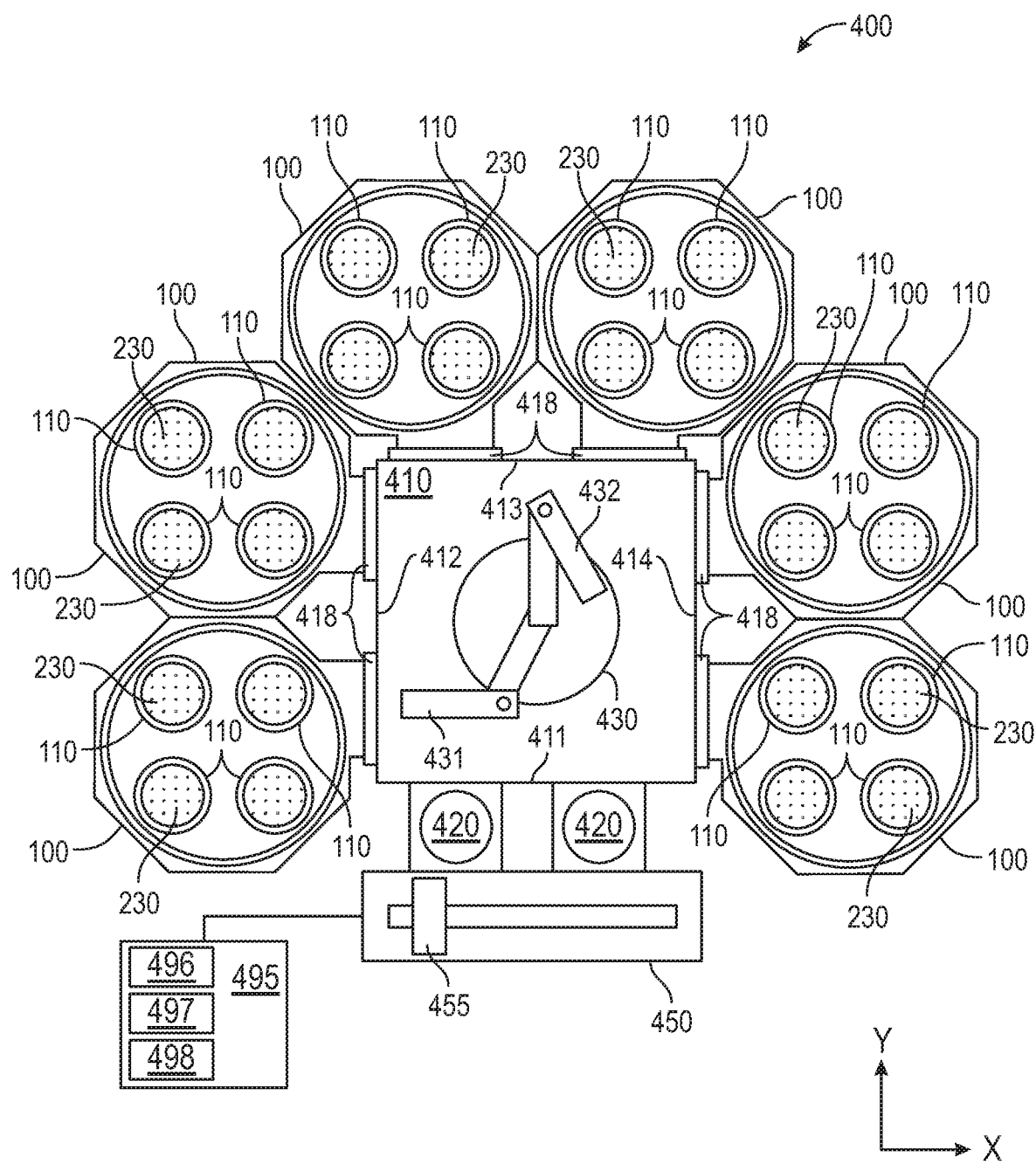
FIG. 4 is a schematic representation of a processing platform in accordance with one or more embodiment of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 may include separate controllers for each of the individual processing chambers 100, central transfer station 410, factory interface 450 and robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support assembly 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

In one or more embodiments, the processing chamber 100 further comprises at least one wafer on the support surface. In some embodiments, the first emissivity and the first temperature and/or the second emissivity and the second temperature provide a steady state temperature of the wafer in the first station and in the second station.

Figure 5A:
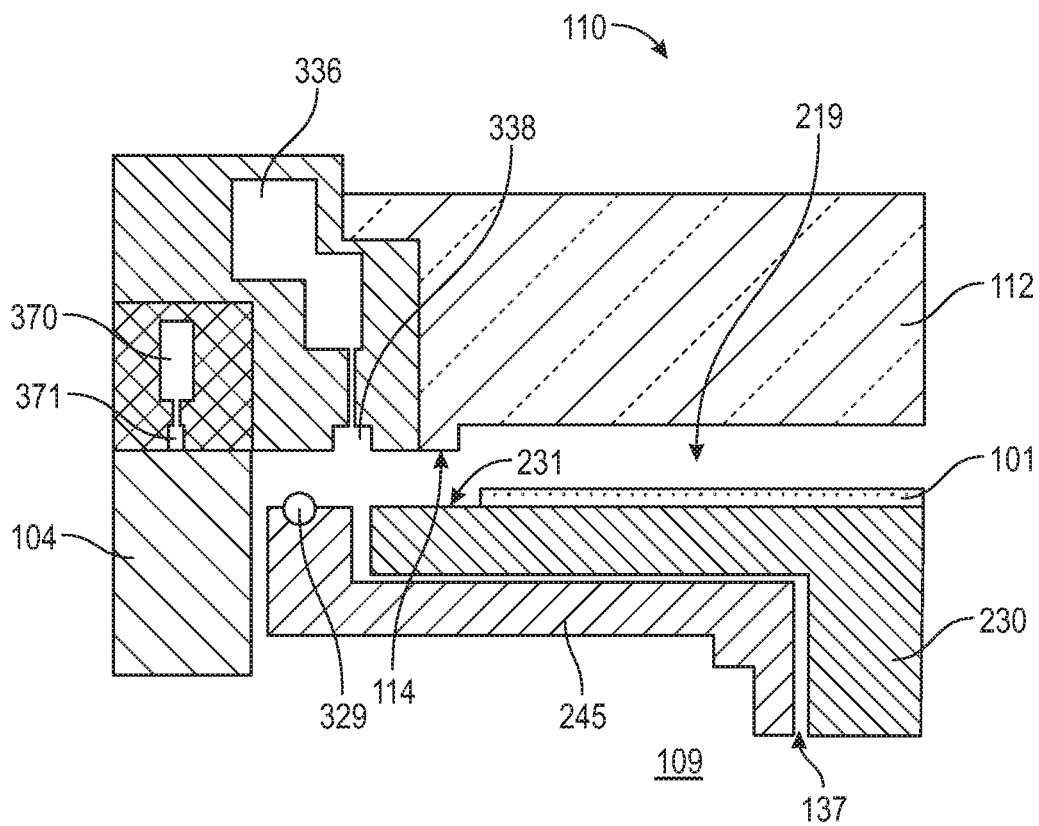
FIGS. 5A and 5B show schematic representations of a process in accordance with one or more embodiment of the disclosure.
Figure 5B:
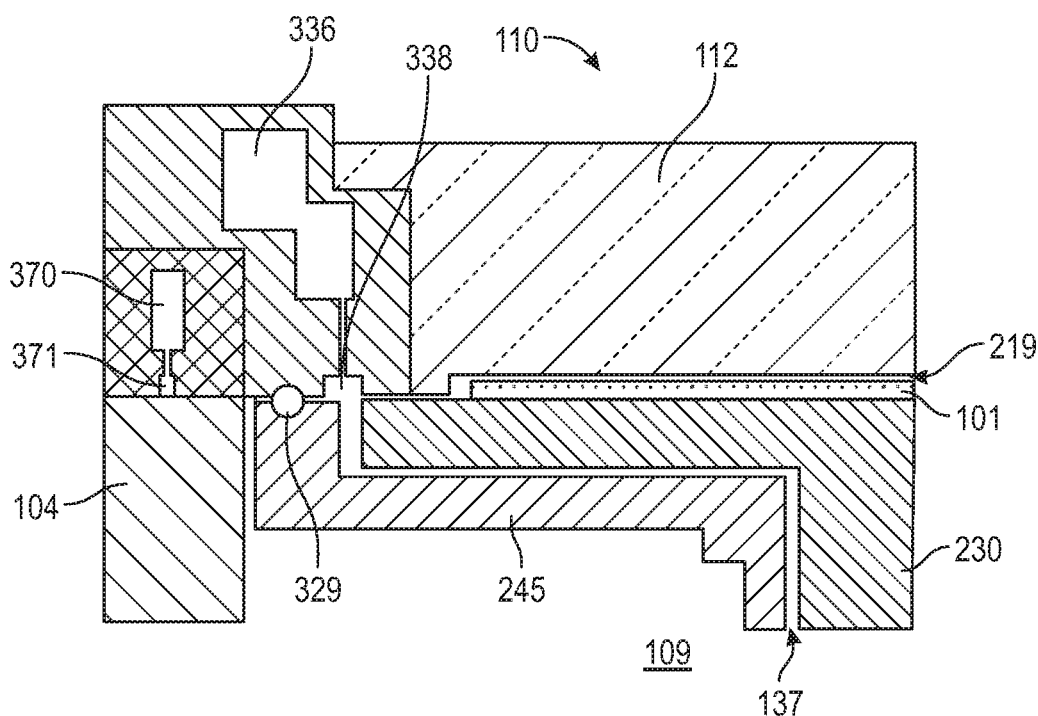

FIGS. 5A and 5B illustrate another embodiment of the disclosure. FIG. 5A shows a partial view of a heater 230 and support plate 245 which has been rotated to a position beneath processing station 110 so that wafer 101 is adjacent the gas injector 112. An O-ring 329 on the support plate 245, or on an outer portion of the heater 230, is in a relaxed state.

FIG. 5B shows the support plate 245 and heater 230 after being moved toward the processing station 110 so that the support surface 231 of the heater 230 is in contact with or nearly contacts the front face 114 of the gas injector 112 in the processing station 110. In this position, O-ring 329 is compressed forming a seal around the outer edge of the support plate 245 or outer portion of the heater 230. This allows the wafer 101 to be moved as close the gas injector 112 as possible to minimize the volume of the reaction region 219 so that the reaction region 219 can be rapidly purged.

Gases which might flow out of the reaction region 219 are evacuated through opening 338 into plenum 336 and to an exhaust or foreline (not shown). A purge gas curtain outside of the opening 338 can be generated by purge gas plenum 370 and purge gas port 371. Additionally, a gap 137 between the heater 230 and the support plate 245 can help to further curtain off the reaction region 219 and prevent reactive gases from flowing into the interior volume 109 of the processing chamber 100.

Referring back to FIG. 4, the controller 495 of some embodiments has one or more configurations selected from: a configuration to move a substrate on the robot between the plurality of processing chambers; a configuration to load and/or unload substrates from the system; a configuration to open/close slit valves; a configuration to provide power to one or more of the heaters; a configuration to measure the temperature of the heaters; a configuration to measure the temperature of the wafers on the heaters; a configuration to load or unload wafers from the heaters; a configuration to provide feedback between temperature measurement and heater power control; a configuration to rotate the support assembly around the rotational axis; a configuration to move the support assembly along the rotational axis (i.e., along the z-axis); a configuration to set or change the rotation speed of the support assembly; a configuration to provide a flow of gas to a gas injector; a configuration to provide power to one or more electrodes to generate a plasma in a gas injector; a configuration to control a power supply for a plasma source; a configuration to control the frequency and/or power of the plasma source power supply; and/or a configuration to provide control for a thermal anneal treatment station.

Figure 6A:
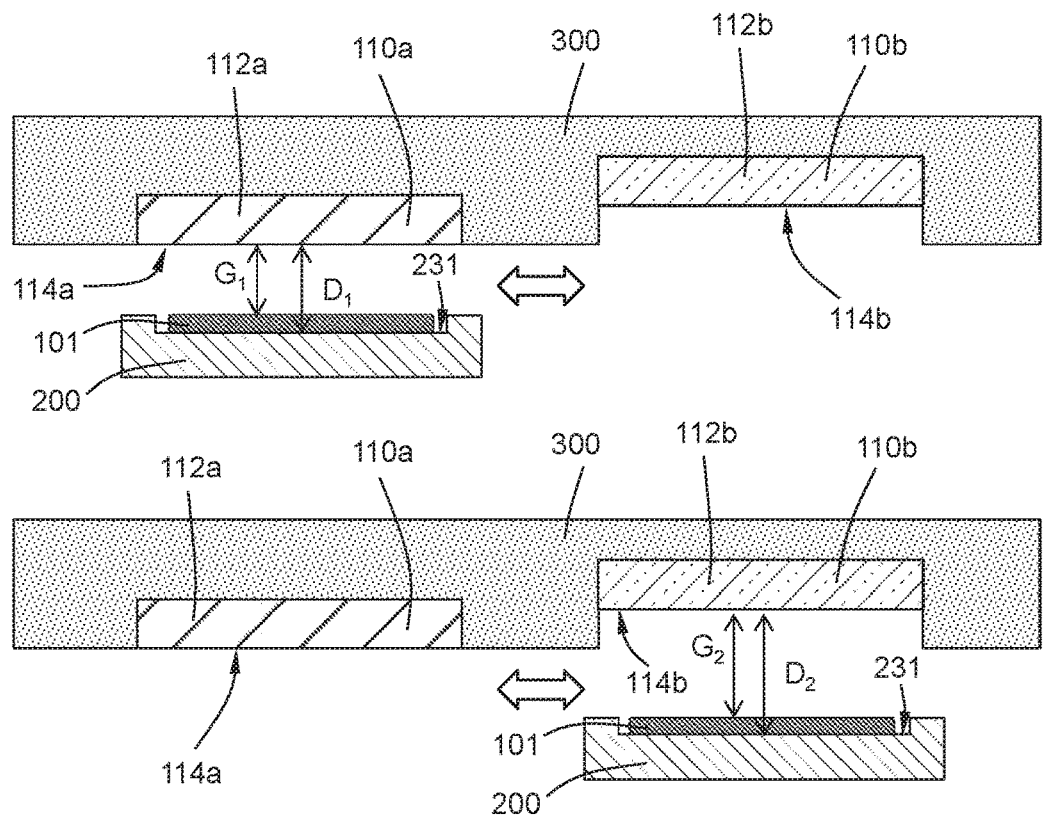
FIG. 6A is a schematic representation of a processing chamber in accordance with one or more embodiment of the disclosure.
Figure 6B:
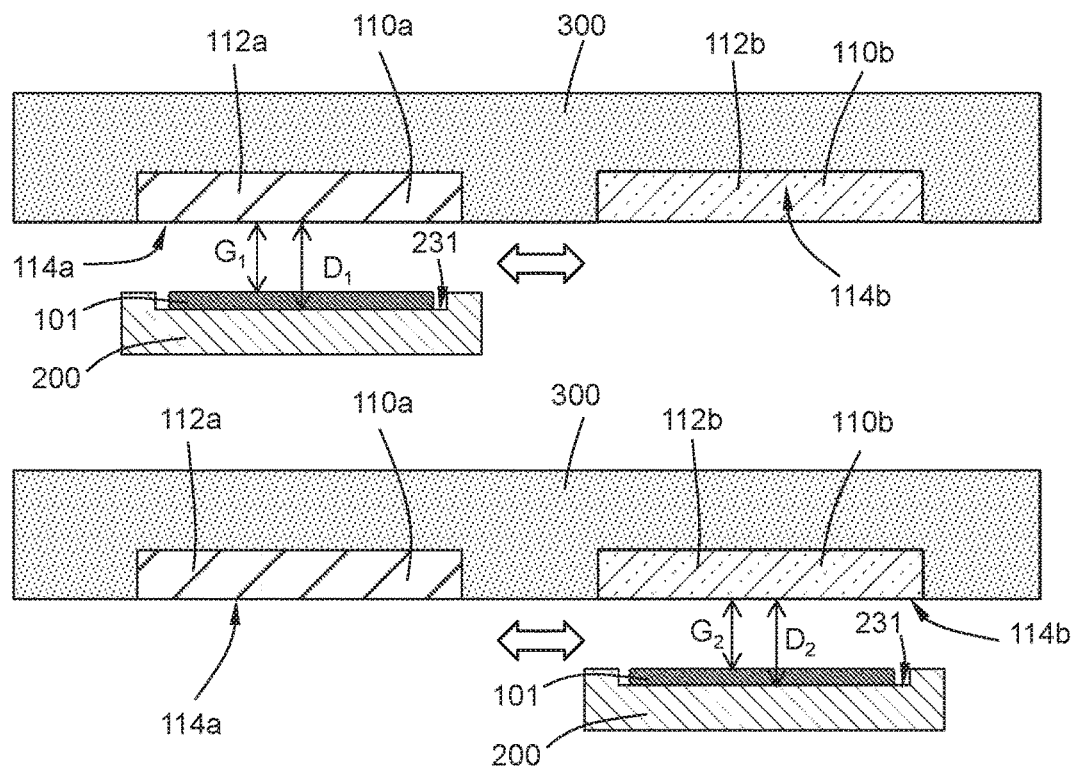
FIG. 6B is a schematic representation of a processing chamber in accordance with one or more embodiment of the disclosure.

Referring to FIGS. 6A-6B, in some processing chambers, a wafer 101 placed on substrate support assembly 200 moves back and forth (chucked to a pedestal heater) from a first processing station 110a to a second processing station 110b. In one or more embodiments, the first processing station 110a may be a thermal showerhead comprised of aluminum and located to form a first gap $G_1$ about 0.5 mm to about 3 mm in distance from the wafer 101. The second processing station 110b may be a plasma station that is comprised of aluminum oxide and is located to form a second gap $G_2$ of about 7 mm to about 15 mm away from the wafer 101.

Due to differences (e.g. gap differences between the first processing station 110a and the second processing station 110b, showerhead emissivity, etc.), the wafer 101 warms up in the second station 110b relative to the first station 110a (i.e. it loses less heat to the above processing station). Additionally, in a simple back and forth process movement, one side of the wafer 101 enters the second processing station 110b first, and that same side of the wafer 101 exits the second processing station 110b last, the wafer 101 develops a temperature gradient.

Accordingly, referring to FIG. 6A, in one or more embodiments, the processing chamber 100 comprises a first processing station 110a and a second processing station 110b. In one or more embodiments, the first processing station 110a comprises a first gas injector 112a having a first face 114a, a first emissivity, and a first temperature, and the second processing station 110b comprises a second gas injector 112b having a second face 114b, a second emissivity and a second temperature. In one or more embodiments, the processing chamber comprises a substrate support assembly 200 comprising a plurality of substantially coplanar support surfaces 231, the substrate support assembly 200 configured to move the support surfaces 231 between the first processing station 110a and the second processing station 110b. As used in this manner, "substantially coplanar" means that the planes formed by the individual support surfaces 231 are within ±5°, ±4°, ±3°, ±2° or ±1° of the planes formed by the other support surfaces 231. In some embodiments, the term "substantially coplanar" means that the planes formed by the individual support surfaces are within ±50 µm, ±40 µm, ±30 µm, ±20 µm or ±10 µm.

In one or more embodiments, as illustrated in FIG. 6A, the first face 114a of the first gas injector 112a of the first processing station 110a is spaced a first distance $D_1$ from the plurality of support surfaces 231 and the second face 114b of the second gas injector 112b of the second processing station 110b is spaced a second distance $D_2$ greater than the first distance $D_1$ from the plurality of support surfaces 231. Stated differently, in some embodiments, the first face 114a of the first gas injector 112a is a first gap $G_1$ distant from the wafer 101 surface and the second face 114b of the second gas injector 112b is a second gap $G_2$ distant, greater than first gap $G_1$, from the wafer 101 surface.

In some embodiments, as illustrated in FIG. 6B, the first face 114a of the first gas injector 112a of the first processing station 110a is spaced a first distance $D_1$ from the plurality of support surfaces 231 and the second face 114b of the second gas injector 112b of the second processing station 110b is spaced a second distance $D_2$ that is equal to the first distance $D_1$ from the plurality of support surfaces 231. Stated differently, in some embodiments, the first face 114a of the first gas injector 112a is a first gap $G_1$ distant from the wafer 101 surface and the second face 114b of the second gas injector 112b is a second gap $G_2$ distant, the same as that first gap $G_1$, from the wafer 101 surface.

In one or more embodiments, the first emissivity is lower than the second emissivity and/or the first temperature is greater than the second temperature. As used herein, the term "emissivity" or "ε" is defined as the ratio of the radiance of a given object to that of a blackbody at the same temperature and for the same spectral and direction conditions. Emissivity is a function of surface morphology, impurity concentration, wavelength, temperature, and the presence of overlayers. Without intending to be bound by theory, it is believed that if both showerheads have the same emissivity and temperature, an increase in temperature will be observed in a station with a larger gap due to a decrease in conductive temperature losses in the larger gap station. It is believed that, to match thermal losses from a wafer in two different stations at the same temperature and different gaps (as shown in FIG. 6A—see $G_1$ and $G_2$), the station with the larger gap ($G_2$) will have a higher emissivity. Higher emissivity will not always be better; there is an optimum emissivity, and above that emissivity, the thermal loss difference will flip, resulting in an increase in heat loss from the wafer. If, for example, the first face emissivity is maintained at about 0.1 in the first processing station with a 1 mm gap, and the second face emissivity is maintained at about 0.8 in the second processing station with a 10 mm gap, the maximum temperature skew across the wafer will be less than or equal to about 0.5° C. across a 300 mm wafer over a period of 0.5 seconds.

In one or more embodiments, a temperature skew of less than or equal to about 0.5° C. over about 0.5 seconds is developed upon moving the wafer between the stations. As used herein, the term "temperature skew" refers to the difference in temperatures between the first processing station 110a and the second processing station 110b. All temperature skew values are based on a 0.5 second time frame. In one or more embodiments, the temperature skew is less than or equal to about 0.5° C., about 0.45° C., about 0.4° C., about 0.35° C., about 0.3° C., about 0.25° C., about 0.2° C., about 0.15° C., about 0.1° C., or about 0.05° C. Without intending to be bound by theory, it is thought that matching thermal losses from a wafer to two different stations will keep the temperatures and temperature non-uniformity on the wafer to a minimum. If, on the other hand, the steady state temperature of the second processing station 110b is higher than the steady state temperature in the first processing station 110a, it is easier for the wafer to heat up because the heat sink (i.e., gas injector) is further from the wafer surface.

Accordingly, in one or more embodiments, the first processing station 110a uses a relatively low emissivity showerhead at higher temperature (e.g. 200° C.), while the second processing station 110b uses a relatively high emissivity showerhead at lower temperature (e.g. 150° C.) in order to minimize transient effects during wafer transfer. In one or more embodiments, the steady state temperature of the wafer is similar in both the first processing station 110a and the second processing station 110b.

In some embodiments, the plurality of substantially coplanar support surfaces 231 comprise heaters 230. In one or more embodiments, the heaters 230 or support surfaces 231 comprise electrostatic chucks.

In one or more embodiments, the first emissivity and the second emissivity are different and the first temperature and the second temperature are different. In other embodiments, the first emissivity and the second emissivity are different and the first temperature and the second temperature are the same.

In one or more embodiments, the first processing station 110a comprises a thermal station and the second processing station 110b comprises a plasma station. In other embodiments, the first processing station 110a comprises a thermal station and the second processing station 110b comprises a thermal station.

With reference to FIGS. 1-6B, one or more embodiments of the disclosure are directed to a processing chamber 100. In one or more embodiments, the processing chamber 100 comprises a thermal processing station (first processing station 110a) comprising a thermal showerhead (gas injector 112a) having a first face 114a, a first emissivity and a first temperature; a plasma processing station (second processing station 110b) comprising a plasma showerhead (gas injector 112b) having a second face 114b, a second emissivity and a second temperature; a substrate support assembly 200 comprising a plurality of substantially coplanar support surfaces 231 having at least one wafer thereon, the substrate support assembly configured to move the at least one wafer between the thermal processing station (first processing station 110a) and the plasma processing station (second processing station 110b); and a controller 495 connected to the plurality of substantially coplanar support surfaces 231.

One or more embodiments are directed to a processing method, the method comprising moving a substrate support surface between a first processing station 110a and a second processing station 110b, the first processing station 110a comprising a first gas injector 112a having a first face 114a spaced a first distance $D_1$ from the support surface 231, a first emissivity and a first temperature, the second processing station 110b comprising a second gas injector 112b having a second face 114b spaced a second distance $D_2$ greater than the first distance $D_1$ from the support surface 231, a second emissivity and a second temperature. In one or more embodiments, the first emissivity is lower than the second emissivity and/or the first temperature is greater than the second temperature.

In one or more embodiments, the processing method further comprises controlling one of more of the first temperature or the second temperature. With reference to FIG. 4, in some embodiments, the processing chamber 100 further comprises a controller 495 connected to the plurality of substantially coplanar support surfaces 231 configured to control one or more of the first temperature or the second temperature.

In one or more embodiments, the processing method further comprises controlling the speed of the movement of the substrate support surface. In some embodiments, the controller 495 controls a movement speed of the substrate support assembly 200.

In one or more embodiments, the processing method further comprises loading at least one wafer onto the substrate support surface.

In one or more embodiments, the processing method further comprises controlling the temperature skew of the at least one wafer. In some embodiments, the controller 295 controls the temperature skew of the at least one wafer.

One or more embodiments of the disclosure are directed to a processing chamber. In one embodiment, a processing chamber 100 comprises a first processing station 110a comprising a first gas injector 112a having a first face 114a, a first emissivity, a first temperature, and first heat loss factor; a second processing station 110b comprising a second gas injector 112b having a second face 114b, a second emissivity, a second temperature, and a second heat loss factor; and a substrate support assembly 200 comprising a plurality of substantially coplanar support surfaces 231, the substrate support assembly 200 configured to move the support surfaces 231 between the first processing station 110a and the second processing station 110b. In one or more embodiments, the first face 114a is spaced a first distance $D_1$ from the plurality of support surfaces 231 and the second face 114b is spaced a second distance $D_2$ from the plurality of support surfaces 231, and one or more of the first distance $D_1$, the first emissivity, the first temperature, the second distance $D_2$, the second emissivity, or the second temperature are adjusted so that the first heat loss factor and the second heat loss factor are substantially the same. As used herein, the term "heat lost factor" refers to a temperature skew developed upon moving the wafer 101 between the first processing station 110a and the second processing station 110b. As used herein, the phrase "the first heat loss factor and the second heat loss factor are substantially the same" means that the temperature skew developed upon moving the wafer 101 between the stations (i.e. 110a and 110b) in a period of time of about 0.5 seconds is less than about 0.5° C.

One or more embodiments of the disclosure are directed to a processing method. In one embodiment, a processing method comprises: moving a substrate support surface 231 between a first processing station 110a and a second processing station 110b, the first processing station 110a comprising a first gas injector 112a having a first face 114a spaced a first distance $D_1$ from the support surface 231, a first emissivity and a first temperature, the second processing station 110b comprising a second gas injector 112b having a second face 114b spaced a second distance $D_2$ from the support surface 231, a second emissivity and a second temperature, wherein one or more of the first distance $D_1$, the first emissivity, the first temperature, the second distance $D_2$, the second emissivity, or the second temperature are adjusted so that the first heat loss factor and the second heat loss factor are substantially the same.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
a first processing station comprising a first gas injector having a first face, a first emissivity and a first temperature;
a second processing station comprising a second gas injector having a second face, a second emissivity and a second temperature; and
a substrate support assembly comprising a plurality of substantially coplanar support surfaces, the substrate support assembly configured to move the support surfaces between the first processing station and the second processing station,
wherein the first face is spaced a first distance from the plurality of substantially coplanar support surfaces and the second face is spaced a second distance from the plurality of substantially coplanar support surfaces, the second distance greater than the first distance, and the first emissivity is lower than the second emissivity and/or the first temperature is greater than the second temperature.

2. The processing chamber of claim 1, wherein when a wafer is on the support surfaces, a temperature skew of less than about 0.5° C. is developed upon moving the wafer between the first processing station and the second processing station in about 0.5 seconds.

3. The processing chamber of claim 1, wherein the first emissivity and the second emissivity are different and the first temperature and the second temperature are different.

4. The processing chamber of claim 1, wherein the first emissivity and the second emissivity are different and the first temperature and the second temperature are the same.

5. The processing chamber of claim 1, further comprising a controller connected to the plurality of substantially coplanar support surfaces configured to control one or more of the first temperature or the second temperature.

6. The processing chamber of claim 1, wherein the first processing station comprises a thermal station and the second processing station comprises a plasma station.

7. The processing chamber of claim 1, wherein the first processing station comprises a thermal station and the second processing station comprises a thermal station.

8. The processing chamber of claim 1, further comprising at least one wafer on the support surfaces.

9. The processing chamber of claim 8, wherein the first emissivity and the first temperature and/or the second emissivity and the second temperature provide a steady state temperature of the wafer in the first processing station and in the second processing station.

10. A processing method comprising:
moving a substrate support surface between a first processing station and a second processing station, the first processing station comprising a first gas injector having a first face spaced a first distance from the substrate support surface, a first emissivity and a first temperature, the second processing station comprising a second gas injector having a second face spaced a second distance from the substrate support surface, a second emissivity and a second temperature,
wherein the second distance is greater than the first distance and wherein the first emissivity is lower than the second emissivity and/or the first temperature is greater than the second temperature.

11. The processing method of claim 10, further comprising controlling one or more of the first temperature or the second temperature.

12. The processing method of claim 10, further comprising loading at least one wafer onto the substrate support surface.

13. The processing method of claim 12, further comprising controlling a temperature skew of the at least one wafer.

14. A processing chamber comprising:
a thermal processing station comprising a thermal showerhead having a first face, a first emissivity and a first temperature;
a plasma processing station comprising a plasma showerhead having a second face, a second emissivity and a second temperature;
a substrate support assembly comprising a plurality of substantially coplanar support surfaces having at least one wafer thereon, the substrate support assembly configured to move the at least one wafer between the thermal processing station and the plasma processing station; and
a controller connected to the plurality of substantially coplanar support surfaces,
wherein the first face is spaced in a range of about 0.5 mm to about 3 mm from the at least one wafer and the second face is spaced in a range of about 7 mm to about 15 mm from the at least one wafer, and the first emissivity is lower than the second emissivity and/or the first temperature is greater than the second temperature.

15. The processing chamber of claim 14, wherein a temperature skew of less than about 0.5° C. is developed upon moving a wafer between the first processing station and the second processing station in about 0.5 seconds.

16. The processing chamber of claim 14, wherein the first face is spaced about 2 mm from the at least one wafer and the second face is spaced in about 15 mm from the at least one wafer.

* * * * *